United States Patent
Schneidereit et al.

(10) Patent No.: US 10,672,943 B2
(45) Date of Patent: Jun. 2, 2020

(54) METHOD AND DEVICE FOR PRODUCING SOLAR CELL STRANDS

(71) Applicant: M10 Industries AG, Freiburg im Breisgau (DE)

(72) Inventors: Günter Schneidereit, Freiburg (DE); Gregor Reddemann, Kirchzarten (DE)

(73) Assignee: M10 Industries AG, Freiburg im Breisgau (DE)

( * ) Notice: Subject to any disclaimer, the term of this patent is extended or adjusted under 35 U.S.C. 154(b) by 133 days.

(21) Appl. No.: 15/547,745

(22) PCT Filed: Feb. 2, 2016

(86) PCT No.: PCT/EP2016/000163
§ 371 (c)(1),
(2) Date: Jul. 31, 2017

(87) PCT Pub. No.: WO2016/128116
PCT Pub. Date: Aug. 18, 2016

(65) Prior Publication Data
US 2018/0090637 A1 Mar. 29, 2018

(30) Foreign Application Priority Data
Feb. 11, 2015 (DE) .................. 10 2015 101 973

(51) Int. Cl.
*H01R 43/00* (2006.01)
*H05K 13/00* (2006.01)
(Continued)

(52) U.S. Cl.
CPC ............ *H01L 31/188* (2013.01); *H01L 31/02* (2013.01); *H01L 31/0504* (2013.01);
(Continued)

(58) Field of Classification Search
CPC . H01L 31/02; H01L 31/0508; H01L 31/0504; H01L 31/188; H01L 31/0512
See application file for complete search history.

(56) References Cited

U.S. PATENT DOCUMENTS 4,534,502 A * 8/1985 Piurek ............... H01L 21/67138
136/244
6,841,728 B2 * 1/2005 Jones ................... H01L 31/188
136/244
(Continued)

FOREIGN PATENT DOCUMENTS

CN 103182579 A 7/2013
CN 103199155 A 7/2013
(Continued)

OTHER PUBLICATIONS

International Search Report from PCT application No. PCT/EP2016/000163 dated Apr. 19, 2016.

*Primary Examiner* — Paul D Kim
(74) *Attorney, Agent, or Firm* — Budzyn IP Law, LLC

(57) ABSTRACT

An uninterrupted production of solar cell strings is provided herein that includes electrically conductive ribbons (2) being dispensed at a dispensing station (4, 5) that has a reserve of ribbons (2), and fed to at least one string (7) of unconnected solar cells (3). The ribbons (2) are kept ready for dispensing on at least two dispensing stations (4, 5) that each have a reserve of ribbon material. At least one ribbon (2) is then dispensed in an automated manner, wherein the dispensing station (4, 5) from which the at least one ribbon (2) is dispensed is selected depending on a reserve of ribbon material that remains or exists in that dispensing station (4, 5), and wherein switching to the at least one other dispensing station (4, 5) takes place at the latest upon complete consumption of the reserve of the dispensing station (4, 5).

22 Claims, 1 Drawing Sheet

(51) Int. Cl.
    *H01L 31/18*     (2006.01)
    *H01L 31/05*     (2014.01)
    *H01L 31/02*     (2006.01)

(52) U.S. Cl.
    CPC ...... *H01L 31/0508* (2013.01); *H01L 31/0512* (2013.01); *Y02E 10/50* (2013.01)

(56) References Cited

U.S. PATENT DOCUMENTS

| | | | |
|---|---|---|---|
| 8,207,012 B2 * | 6/2012 | Pinarbasi | H01L 31/0322 257/E21.001 |
| 8,247,681 B2 * | 8/2012 | Reinisch | H01L 31/05 136/244 |
| 8,309,840 B2 * | 11/2012 | Stevens | H01L 31/048 136/251 |
| 8,485,774 B2 * | 7/2013 | Risch | H01L 31/188 414/788 |
| 9,065,008 B2 * | 6/2015 | Degroot | H01L 31/188 |
| 2003/0127124 A1 | 7/2003 | Jones et al. | |
| 2007/0294883 A1 | 12/2007 | Napetschnig | |

FOREIGN PATENT DOCUMENTS

| | | |
|---|---|---|
| EP | 2 299 500 A1 | 3/2011 |
| WO | 96/17387 A1 | 6/1996 |
| WO | 2012/016103 A2 | 2/2012 |

* cited by examiner

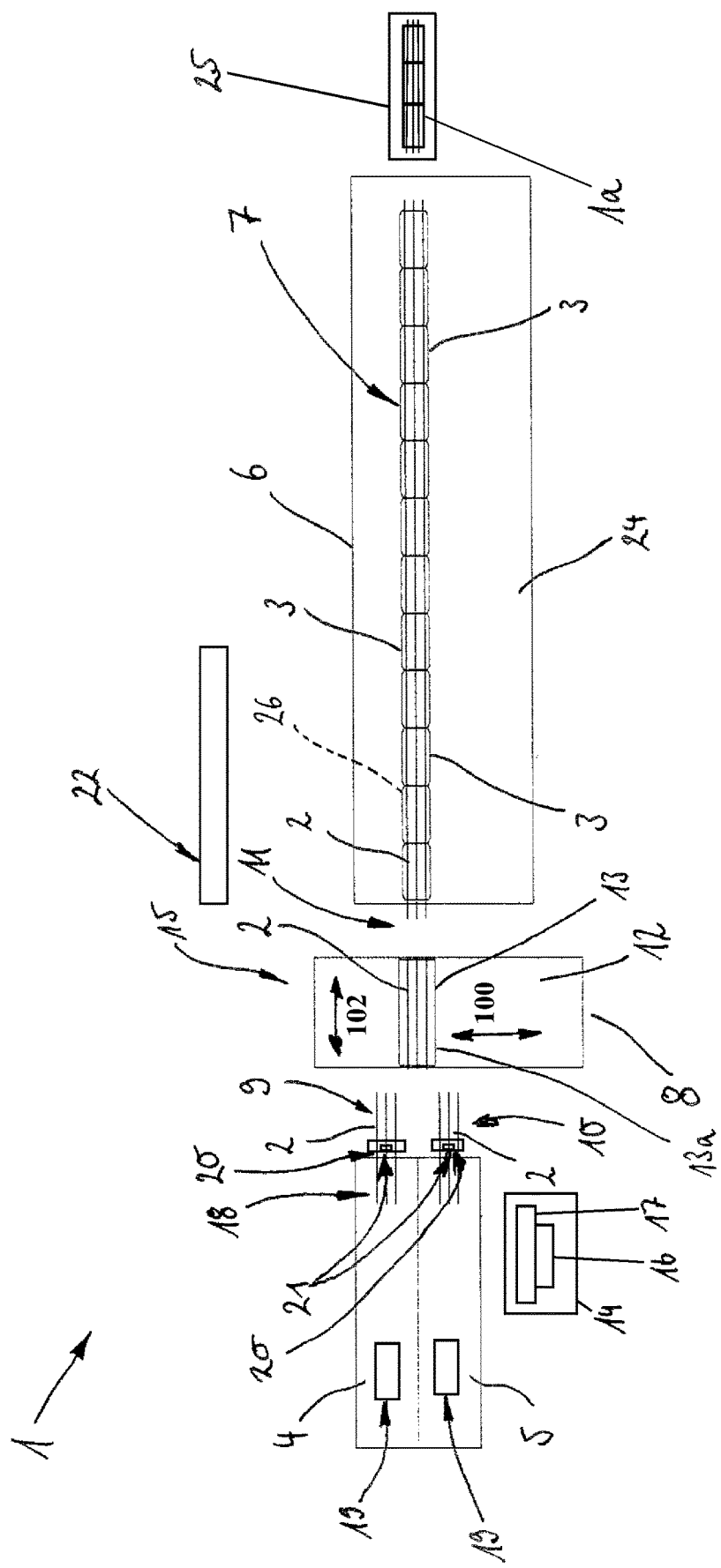

METHOD AND DEVICE FOR PRODUCING SOLAR CELL STRANDS

This application is a National Stage application under 35 U.S.C. § 371 of PCT Application No. PCT/EP2016/000163, filed Feb. 2, 2016, the entire contents of which are incorporated by reference herein.

The invention relates to a method for producing solar cell strings, wherein electrically conductive ribbons are dispensed at a dispensing station that has a reserve of ribbons, and fed to at least one string of unconnected solar cells, whereupon the ribbons are connected to the solar cells of the string so as to form a finished solar cell string, wherein the ribbons are kept ready for dispensing on at least two dispensing stations that each a reserve of ribbon material, wherein at least one ribbon is dispensed in an automated manner on at least one of the at least two dispensing stations, wherein the dispensing station from which the at least one ribbon is dispensed is selected depending on a reserve of ribbon material that remains or exists in that dispensing station, and wherein switching to the at least one other dispensing station takes place at the latest upon complete consumption of the reserve of the dispensing station.

The invention furthermore relates to a device for producing solar cell strings composed of solar cells that are interconnected by means of electrically conducting ribbons, having a dispensing station for electrically conducting ribbons, and having a solar cell string bearing for receiving and keeping ready at least one string of unconnected solar cells, and having a connection station in which the electrically conducting ribbons are connectable to the solar cells, wherein the device apart from the one has at least one further dispensing station and at least one transportation device for receiving and transporting at least one ribbon from at least one of the at least two dispensing stations to the solar cell string bearing.

Manufacturing of solar cell strings which then can be installed in solar modules according to such a method is known, for example from EP 2 299 500 A1, CN 103 199 155 A, and CN 103 182 579 A1. A device as described at the outset for producing solar cell strings can be employed herein. Devices of this type are likewise previously known from EP 2 299 500 A1, CN 103 199 155 A1, and CN 103 182 579 A.

Further published prior art which is in the technical field of the also automated production of solar cell strings is to be found in the publications US 2007/0294883 A1, US 2003/0127124 A1, WO 96/17387 A1, and WO 2012/016103 A2, which relate to various methods and devices for producing solar cells.

A certain issue in the known methods and devices can exist in that the production process of the solar cell strings has to be interrupted when a reserve of ribbons, in particular a reserve roll on which the ribbons are kept ready for dispensing, has been consumed and has to be replaced by a new reserve roll.

It is therefore an object of the invention to provide a method and a device of the type mentioned at the outset by way of which operational interruptions of this type can be minimized or even avoided.

In order for this object to be achieved in the case of the method defined at the outset, the features of patent claim 1 are provided. The object is achieved in particular in that the ribbons are kept ready for dispensing on at least two dispensing stations that each have a reserve of ribbon material, and in that at least one ribbon is dispensed in an automated manner on at least one of the at least two dispensing stations. Herein, the dispensing station from which the at least one ribbon is dispensed is selected depending on a reserve of ribbon material that remains or exists in that dispensing station. Switching to the at least one other dispensing station takes place at the latest upon complete consumption of the reserve of the selected dispensing station. In this way, the ribbons can initially be retrieved from one dispensing station until a reserve, in particular a reserve roll of that dispensing station has been consumed. Since the ribbons are dispensed from the at least second dispensing station, or are retrieved from the latter, respectively, at the very moment at which a reserve roll has been consumed, consumption-related operational interruptions such as are required in the methods and devices known in the prior art can be minimized or even avoided.

It is provided according to the invention that at least one ribbon is dispensed in an automated manner from at least one of the at least two dispensing stations and is deposited on a transportation device, in particular on a displaceable transportation slide carrier. The transportation device for receiving at least one ribbon is then moved, preferably displaced, to a receiving position that is assigned to one of the at least two dispensing stations. At least one ribbon is deposited on the transportation device once the latter has reached the respective receiving position. The transportation device, upon receiving at least one ribbon is then moved to a dispensing position that is adjacent to the solar cell string bearing for the at least one string of unconnected solar cells that is to be equipped with ribbons. The at least one ribbon is retrieved from the transportation device preferably in an automated manner and be fed to the solar cells once the transportation device has reached the dispensing position thereof.

Of course, two or more transportation devices can be employed in the method, should this be required by cycle times to be achieved.

It can be expedient herein when at least one ribbon is deposited on at least one transportation receptacle that is configured on the transportation device. The at least one transportation receptacle herein can be understood to be an element or part of the transportation device. In this way, the at least one ribbon can be transported with the required precision on the at least one transportation receptacle, and be fed to the solar cells that are kept ready.

It can be advantageous when the transportation device and/or a transportation receptacle, for example the aforementioned transportation receptacle, for receiving at least one ribbon are/is moved, in particular displaced, sequentially and/or in a predetermined sequence to the receiving positions that are assigned to the at least two dispensing stations. It is possible in this way for the at least two dispensing stations to be approached by the transportation device, or by the at least one transportation receptacle that is provided on the latter, and for ribbons to be retrieved in a predefined sequence, for example depending on a reserve of ribbon material that remains in the dispensing stations.

In the case of one embodiment of the method it can be provided that the at least one transportation receptacle of the transportation device is configured as a transportation slide and on a transportation slide carrier of the transportation device that is movable in the conveying direction of the ribbons is displaced transversely to the conveying direction of the ribbons, so as to reach the receiving positions of the at least two dispensing stations and to receive a required number of ribbons there.

It can be particularly advantageous herein when a route or a displacement path of the transportation device and/or of a transportation receptacle, for example of the at least one transportation receptacle already mentioned above, between the at least two receiving positions and the dispensing position is determined depending on at least one defined parameter, in particular depending on a reserve of ribbon material in the at least two dispensing stations. The route and/or the displacement path of the transportation device and/or of the at least one transportation receptacle of the transportation device herein can be determined such that a reserve of ribbon material of one dispensing station, by dispensing ribbons to the transportation device, or to the at least one transportation receptacle, respectively, is entirely or partially consumed before a reserve of the at least one other dispensing station.

It can be ensured in this way that the at least two dispensing stations are not depleted at the same time, and moreover that a sufficiently large reserve which enables an exhausted or depleted dispensing station to be equipped with new ribbon material without having to resort to interrupting the manufacturing process remains in at least one of the at least two dispensing stations.

It can be provided herein that a reserve of ribbons in the at least two dispensing stations is measured or determined by a controller or regulator unit, in particular by means of a monitoring device and/or by means of a sensor, and in that the controller and/or regulator unit emits a control signal to the transportation device, in particular to a drive device of the transportation device, said control signal depending on the measured or determined reserve of the at least two dispensing stations and predefining the displacement path and/or the route of the transportation device and/or of the transportation receptacle. In this way, the aforedescribed reserve-dependent or consumption-dependent, respectively, route of the transportation device or of the at least one transportation receptacle can be predefined in an automated manner in that the current consumption and the remaining reserve in the at least two dispensing stations is continually monitored.

It should be pointed out that the aforementioned drive device of the transportation installation, should the latter have a transportation slide carrier and at least one transportation receptacle that is configured as a transportation slide, can be connected to the transportation slide and to the transportation slide carrier in such a manner that both of the former can be moved, in particular displaced, in the desired manner with the aid of the drive device.

As has been described above, it can be expedient when the ribbons on the transportation device are deposited on predefined transportation receptacles that are configured on the transportation device. This can facilitate an accurate retrieval of the ribbons that are kept ready on the transportation device and an accurate transfer of said ribbons to a downstream station, in particular to the solar cell string bearing.

It can be particularly expedient when a number of transportation receptacles corresponds to a number of strings of unconnected solar cells that have to be simultaneously equipped with ribbons. It is thus possible to simultaneously retrieve ribbons from the transportation device for all of the rows or strings of unconnected solar cells that are kept ready on the solar cell string bearing, and to feed said ribbons to the strings, without having to resort to repositioning the transportation device that is located in the dispensing position.

In the case of one embodiment of the method it can be provided that the transportation device and/or the at least one transportation receptacle on the transportation device are/is moved or displaced such that the at least one transportation receptacle on the transportation device sequentially reaches the receiving positions on the at least two dispensing stations. Should more than one transportation receptacle be configured on the transportation device, the individual transportation receptacles for the ribbons that are provided on the transportation device can be sequentially occupied by ribbons in this way, and the dispensing stations can be approached in a specific sequence. Moreover, it can be expedient when at least one ribbon is deposited on one of the plurality of transportation receptacles of the transportation device per dispensing cycle.

In order for the method to be carried out in a fully automated manner, it can be moreover expedient when a ribbon or the ribbons that is/are deposited on the transportation device by means of a handling device is retrieved from the transportation device that is moved to the dispensing position and is fed to the stand of unconnected solar cells that is kept ready. However, it is also possible that from each of the ribbon receptacles on the transportation device at least one ribbon by means of a handling device is retrieved from the transportation device that is moved to the dispensing position and is in each case fed to a string of unconnected solar cells that is kept ready. However, it is also possible that a plurality of ribbons are fed to one string of unconnected solar cells.

In the case of one embodiment of the method it can moreover be provided that a defined piece of ribbon material is unwound from a reserve roll having ribbon material for producing a ribbon, and upon unwinding is trimmed to a desired length, so as to produce a ribbon which can then be dispensed to the transportation device in the aforedescribed manner.

As has already been indicated above, the transportation device can be configured as a transportation slide carrier, and the at least one transportation receptacle can be configured as a transportation slide. In this way, the at least one transportation receptacle can then be displaced on the transportation slide carrier so as to be able to approach the individual receiving positions of the dispensing stations in order to receive at least one ribbon. The at least one transportation receptacle that is equipped with at least one ribbon can then be transported conjointly with the transportation slide carrier from the receiving position that is adjacent to the dispensing stations toward the dispensing position that is adjacent to the solar cell string bearing, so as to dispense the at least one ribbon to the at least one solar cell string that is kept ready. This transportation movement herein can be performed in the conveying direction of the ribbons from the at least two dispensing stations.

A device having the features of patent claim 11 is also proposed in order for the aforementioned object to be achieved. In the case of the device defined at the outset, the object is achieved in particular in that the device apart from the one has at least one further dispensing station and at least one transportation device for receiving and transporting at least one ribbon from at least one of the at least two dispensing stations to the solar cell string bearing. The at least one transportation device herein can be disposed between the at least two dispensing stations and the solar cell string bearing, and be movable, in particular displaceable, therebetween. In this way, a device which is suitable for carrying out the aforedescribed method and by way of which consumption-related downtime of the device can be avoided is achieved.

According to the invention it is provided according to the invention that each of the at least two dispensing stations in each case is assigned one receiving position to which the at least one transportation device is movable for receiving at least one ribbon that is dispensed from one of the at least two dispensing stations. It can be moreover be provided that the solar cell string bearing is assigned a dispensing position to which the at least one transportation device is movable for dispensing at least one ribbon on at least string of unconnected solar cells that is kept ready on the solar cell string bearing. In this way, the transportation device can be moved between predefined receiving positions and at least one predefined dispensing position, so as to transport the ribbons in the aforedescribed manner from the at least two dispensing stations to the solar cell string bearing.

It can be particularly expedient when the at least one transportation device has at least one transportation receptacle on which at least one ribbon to be transported is depositable.

It can be furthermore provided that a number of transportation receptacles corresponds to a number of bearing places, in particular disposed beside one another, for strings of unconnected solar cells on the solar cell string bearing. It can moreover be advantageous when the transportation receptacles are disposable and/or disposed, in particular beside one another, so as to correspond to an arrangement of bearing places for strings of unconnected solar cells on the solar cell string bearing, in particular in the case of a transportation device that is located in the dispensing position.

This enables all solar cell strings to be simultaneously equipped with ribbons at a high operating speed.

The at least one transportation device and/or a or the at least one transportation receptacle herein is movable transversely or orthogonally to the orientation of the at least one string of unconnected solar cells that is to be equipped with ribbons, and/or transversely or orthogonally to the conveying direction of the ribbons from the at least two dispensing stations, in particular between the receiving positions that are assigned to the at least two dispensing stations, so as to be able to carry out the required transportation movements.

In the case of one embodiment of the device according to the invention, said embodiment being of particular significance, it can furthermore be provided that the at least one transportation device has a transportation slide carrier, and in that the at least one transportation receptacle of the at least one transportation device is configured as a transportation slide. It can be provided herein that the at least one transportation receptacle on the transportation slide carrier is disposed between receiving positions of the dispensing stations, in particular so as to be displaceable transversely or orthogonally to the conveying direction of the ribbons.

It can be expedient when the transportation slide carrier between the dispensing stations and the solar cell string bearing is movable in and counter to the conveying direction of the ribbons. The at least one transportation receptacle that is configured as a transportation slide between the receiving positions of the dispensing stations on the transportation slide carrier can be moved transversely or orthogonally, respectively, to the conveying direction, so as to receive ribbons from the dispensing stations. The required movements are thus carried out by two elements of the transportation device that are movable in a mutually independent manner in different directions, wherein the transportation slide carrier can transport the transportation slide together with the ribbons placed thereon from the dispensing stations to the solar cell string bearing.

In the case of one particularly expedient embodiment of the device it can be provided that a transportation receptacle, for example the at least one transportation receptacle that has already been mentioned above, of the transportation device, in the case of the transportation device being located in the dispensing position, is aligned in the continuation, in particular in the direction of longitudinal extent, of a string of unconnected solar cells that is kept ready on the solar cell string bearing. In this way, the transportation device can be moved in a reciprocal manner between the at least two dispensing positions and the solar cell string bearing by way of a simple and linear movement. Moreover, in this way the ribbons can be transferred in a very simple manner from the respective transportation receptacle to the solar cell string bearing and to the at least one string of unconnected solar cells that is kept ready there for equipping.

It can moreover be provided that the transportation device is movable transversely or orthogonally to the orientation of the at least one string of unconnected solar cells that is to be equipped with ribbons, and/or transversely or orthogonally to the conveying direction of the ribbons, in particular between the receiving positions that are assigned to the at least two dispensing stations.

In order to be able to predefine a displacement path or a route of the transportation device, for example depending on the current consumption and/or on the reserve of ribbon material that remains in the at least two dispensing stations, it is expedient when the device has a controller and/or regulator unit. Said controller and/or regulator unit can be adapted for controlling the at least two dispensing stations and/or the transportation device, in particular a drive device for a or the transportation slide carrier and/or for a or the at least one transportation receptacle of the transportation device. On account thereof, the at least two dispensing stations and/or the transportation device can be selected and/or controlled with the aid of the controller and/or regulator unit.

In order for a reserve of ribbon material in the at least two dispensing stations to be determined, it can furthermore be expedient when the device, in particular a controller and/or regulator unit, for example the controller and/or regulator unit that has already been mentioned above, has a monitoring device, preferably having at least one sensor.

It can moreover be provided that the device, in particular the controller and/or regulator unit, is adapted for controlling the movements of the transportation device and/or a transportation receptacle, for example the at least one transportation receptacle that has already been mentioned above, depending on a consumption of a reserve of ribbons and/or of a remaining residual stock of ribbons in the at least two dispensing stations. As has been mentioned above, the device can be adapted in particular for controlling a drive device, for example the drive device that has already been mentioned above, of the transportation slide carrier, and/or the at least one transportation receptacle of the transportation device, depending on a consumption of a reserve of ribbons and/or of a remaining residual stock of ribbons in the at least two dispensing stations.

When the device, in particular the controller and/or regulator unit, and/or a monitoring device, for example the monitoring device that has already been mentioned above, has a counting installation, the consumption and a reserve of ribbons or a residual stock thereof remaining in the at least two dispensing stations can be determined in a simple way. The counting installation herein can be adapted for monitoring a number of dispensed ribbons and/or a reserve of ribbons of the at least two dispensing stations.

With the aid of the counting installation it can then be avoided that the reserve of ribbon material is depleted simultaneously in the at least two dispensing stations. The counting installation herein can establish a number of dispensing procedures, or of method steps, respectively, of the transportation device, and then transmit this information to the controller and/or regulator unit of the device which then can predefine the route or the displacement path, respectively, of the transportation device, depending on the residual reserve that thus has been established at least in an indirect manner.

One further expedient design embodiment of the invention in terms of a long as possible operating mode without interruptions can provide that each of the at least two dispensing stations has at least one, however preferably two, three, four, or five, or more reserve rolls on ribbon material.

When each of the at least two dispensing stations contains a plurality of reserve rolls it is possible that ribbons can be delivered in an uninterrupted manner from the dispensing stations in any case, and in the case of one roll being consumed, other dispensing stations and/or reserve rolls can nevertheless continue to dispense a sufficient amount of ribbon.

It can moreover be provided that the device has at least one trimming station having a cutting device for trimming electrically conducting ribbons of ribbon material that is rolled up on a reserve roll. Each of the at least two dispensing stations can preferably be assigned in each case one trimming station having a cutting device for trimming electrically conducting ribbons of ribbon material that is rolled up on a reserve roll. In this way, the ribbons can be trimmed to the desired length from the rolled-up ribbon material which is present as a quasi-endless string and subsequently be dispensed onto the transportation device or onto the transportation slide carrier, respectively.

In order for the ribbons to be transferred form the transportation device that is located in the dispensing position to the at least one string of unconnected solar cells that is kept ready on the solar cell string bearing, the device can have a handling unit. This handling unit can be configured in particular as a gripper, a slide, and/or else as a suction installation.

It can furthermore be provided that the at least two dispensing stations and the solar cell string bearing in the conveying direction of the ribbons and/or in the direction of extent of the at least one string of unconnected solar cells have a mutual spacing. The spacing between the at least two dispensing stations and the solar cell string bearing herein is capable of being bridged by a movement, in particular in the conveying direction of the ribbons and/or in the direction of extent of the at least one string of unconnected solar cells, from one of the receiving positions to the dispensing position. In the case of another embodiment of the invention, it can additionally or alternatively also be provided to this end that this spacing between the at least two dispensing stations and the solar cell string bearing is capable of being bridged by means of a handling unit, for example of the handling unit that has already been mentioned above.

In order for the production method to be carried out in a particularly economical manner, the solar cell string bearing can be configured on a transportation device, in particular on a conveyor belt, by way of which transportation installation strings of solar cells that are equipped with ribbons can be fed to a downstream connection station, for example to the connection station that has already been mentioned above, of the device. In this way, it is also possible to place solar cells or solar cell blanks, respectively, onto the solar cell string bearing and to continually equip said solar cells or solar cell blanks with ribbons, since solar cell strings that are equipped with ribbons can be fed simultaneously and continually by means of the conveyor belt to the downstream connection station in which the ribbons are connected to the solar cells so as to produce the solar cell string.

In the case of one embodiment of the invention, said embodiment being of particular significance, it can be provided that the device has four dispensing stations, each having one receiving position, and two transportation devices each having six transportation receptacles for in each case at least one ribbon. In the case of this exemplary embodiment of the invention it can moreover be provided that at least two, in particular three, four, five, six, seven, eight, or nine bearing places for strings or rows of unconnected solar cells are provided on the solar cell string bearing, such that up to two, three, four, five, six, seven, eight, or nine strings or rows of unconnected solar cells are simultaneously disposable on the solar cell string bearing.

Of course, it is also conceivable for even more dispensing stations each having one receiving position and one solar cell string bearing which has more than nine bearing places for strings of initially unconnected solar cells to be provided. The number of dispensing stations, or of the bearing places for strings of unconnected solar cells, respectively, herein relates to the volume of solar cell strings that is to be produced per unit of time by this device.

An exemplar embodiment of the invention is described in more detail hereunder by means of the drawing. In a highly schematic illustration:

FIG. 1: shows a highly schematic plan view of a device according to the invention, for visualizing the production method according to the invention.

FIG. 1 shows a device that in its entirety is identified by the reference sign 1, for producing solar cell strings 1a composed of solar cells 3 that are interconnected by means of electrically conducting ribbons 2. The device 1 has two dispensing stations 4 and 5 for electrically conducting ribbons 2, and a solar cell string bearing 6 for receiving and keeping ready at least one string 7 of initially as yet unconnected solar cells 3. A connection station 25 in which the electrically conducting ribbons 2 can be connected to the solar cells 3 and the solar cell strings 1a can be completed is also associated with this device 1.

Apart from the total of two dispensing stations 4 and 5 in the present example, the device 1 moreover has a transportation device 8 which serves for receiving and transporting at least one ribbon 2 from at least one of the total of two dispensing stations 4 and 5 to the solar cell string bearing 6. Each of the two dispensing stations 4 and 5 is assigned in each case to one receiving position 9 or 10, respectively, to which the transportation device 8 is movable for receiving at least one ribbon 2 that is dispensed from one of the two dispensing stations 4 and 5. In the present exemplary embodiment, the two dispensing stations 4 and 5 in each case simultaneously dispense three ribbons 2.

In the case of embodiments of the device 1 or of the method, respectively, that are not illustrated in the figures, it is provided that four, five, six, or seven, or more ribbons 2 are simultaneously dispensed from one of the dispensing stations 4, 5 and fed to a string 7 of unconnected solar cells 3.

The solar cell string bearing 6 is furthermore assigned a dispensing position 11 to which the transportation device 8 is movable for dispensing at least one ribbon 2 onto at least one string 7 of unconnected solar cells 3 that is kept ready on the solar cell string bearing 6.

It can be seen in FIG. 1 that the transportation device 8 comprises a transportation slide carrier 12 that is displaceable between the two dispensing stations 4 and 5 and the solar cell string bearing 6, and at least one transportation receptacle 13. Herein, so many transportation receptacles 13 can be provided on the transportation device 8 as there are bearing places 26 on the solar cell string bearing 6. On these bearing places 26, of which only one is shown in FIG. 1, a plurality of strings 7 of unconnected solar cells 3, which are to be simultaneously equipped with ribbons 2, can be disposed adjacent to one another.

FIG. 1 shows that a total of three ribbons 2 are deposited on the single transportation receptacle 13 in the present exemplary embodiment of the device 1.

It becomes clear according to FIG. 1 that the arrangement and the alignment of the transportation receptacle 13 on the transportation device 8 corresponds to the arrangement and the alignment of the single string 7 of unconnected solar cells 3 in the present example, said string 7 being placed onto the bearing place 26 on the solar cell string receptacle 6.

FIG. 1 also shows that the transportation receptacle 13 of the transportation device 8 in the case of the transportation device 8 being located in the dispensing position 11 is aligned in the continuation and in the direction of longitudinal extent of the string 7 of unconnected solar cells 3 that is kept ready on the solar cell string bearing 6, so as to be in alignment with the string 7.

The two double arrows 100, 102 highlight the movements which can be carried out by the transportation device 8 and the movable component parts thereof, specifically by the transportation slide carrier 12 and the transportation receptacle 13, during the operation of the device 1. Herein, the transportation device 8 in its entirety, and in particular the transportation slide carrier 12, can be repositioned in the direction of the double arrow 102, so as to transport the ribbons 2 from the dispensing stations 4, 5 to the solar cell string bearing 6.

The transportation receptacle 13 in the present case is configured as the transportation slide 13a which on the transportation device 8 and relative thereto can be displaced in both directions of the double arrow arrow 1, so as to reach the receiving positions 9, 10 ahead of the two dispensing stations 4, 5.

As has been described above, the transportation device 8 has the transportation slide carrier 12 which carries the transportation receptacle 13, serves the latter as a guide rail, and extends across the entire transverse width in front of the dispensing stations 4 and 5 of the device 1.

The transportation receptacle 13 that is configured as the transportation slide 13a on the transportation slide carrier 12 is moved orthogonally to the orientation of the at least one string 7 of unconnected solar cells 3 that is to be equipped with ribbons 2, and thus also transversely and orthogonally to the conveying direction of the ribbons 2 between the dispensing positions 9 and 10 that are assigned to the two dispensing stations 4 and 5, so as to receive ribbons 2 from the two dispensing stations 4, 5.

Even when more than only one transportation receptacle 13 is provided on the transportation device 8, the plurality of transportation receptacles 13 of which all are configured as transportation slides 13a in this exemplary embodiment can be moved in both directions of the double arrow 100 on the transportation slide carrier 12 of the transportation device 8, so as to approach the individual dispensing stations 4, 5 in order to receive ribbons 2 by way of a predetermined route or sequence.

The device 1 moreover has a controller and/or regulator unit 14 which is adapted for controlling the two dispensing stations 4 and 5 and the transportation device 8, in particular a drive device 15 for the transportation device 8. The two dispensing stations 4, 5 can be selected and controlled by way of the controller and/or regulator unit 14, and the transportation device 8 including the component parts thereof, specifically the transportation slide carrier 12 and the transportation receptacle 13 can be controlled by way of the former.

The drive device 15 herein is adapted for driving both the transportation slide carrier 12 and the transportation receptacle 13 of the transportation device 8 that is configured as the transportation slide 13a, and is connected to both.

The controller and/or regulator unit 14 moreover comprises a monitoring device 16 which has at least one sensor 17. The monitoring device serves for determining a reserve of ribbon material in the two dispensing stations 4, 5. The device 1 herein, with the aid of the controller and/or regulator unit 14, is adapted for controlling the movements of the transportation device 8, in particular for controlling the drive device 15 of the transportation device 8, depending on the consumption of a reserve of ribbons 2 in the two dispensing stations 4, 5.

The device 1 moreover has a counting installation 18 for determining the consumption and the remaining reserve of ribbons 2 or of ribbon material, respectively, in the two dispensing stations 4, 5. The counting installation 18 herein is adapted for monitoring a number of dispensed ribbons 2 and a reserve of ribbons 2 of the two dispensing stations 4, 5.

Each of the two dispensing stations 4, 5 is equipped with a plurality of reserve rolls 19 having ribbon material, such that the production process can run without interruptions over a long period of time.

In order for electrically conducting ribbons 2 of ribbon material that is rolled up on the reserve rolls 19 to be able to be trimmed, the device 1, in particular each of the two dispensing stations 4, 5 has in each case one trimming station 20 having a cutting device 21.

The device 1, by way of a handling unit 22, is equipped for transferring ribbons 2 from the transportation receptacle 13 that is located in the dispensing position 11, and/or from the transportation device 8, to the at least one string 7 of unconnected solar cells 3 that is kept ready on the solar cell string bearing 6. This handling unit 22 herein can also be configured as a gripper, a slide, or else as a suction installation.

The two dispensing stations 4 and 5 and the solar cell string bearing 6 in the conveying direction of the ribbons and in the direction of extent of the at least one string 7 of unconnected solar cells 3 have a mutual spacing. This spacing between the two dispensing stations 4 and 5 and the solar cell string bearing 6 can be bridged by a movement of the transportation device 8 from one of the receiving positions 9 or 10 to the dispensing position 11, that is to say in the conveying direction of the ribbons 2 and in the direction of extent of the at least one string 7 of unconnected solar cells 3. This movement is visualized by means of the double arrow 102.

A residual spacing remaining between the two dispensing stations 4 and 5 and the solar cell string bearing 6, or between the transportation device 8 in the dispensing position 11 and the solar cell string bearing 6, respectively, can be bridged by means of the handling unit 22.

The solar cell string bearing 6 is disposed on a transportation installation 24 that is configured as a conveyor belt, by way of which strings 7 of solar cells 3 that are equipped with ribbons 2 can be fed to a downstream connection station 25 of the device 1.

A method as described hereunder can be carried out on the aforedescribed device 1.

It is provided herein that in the case of the method for producing solar cell strings the electrically conducting ribbons 2 are dispensed on the two dispensing stations 4, 5. Each of the two dispensing stations 4, 5 has a reserve of ribbons 2. The ribbons 2 are fed to at least one string 7 of unconnected solar cells 3, whereupon the ribbons 2 are connected to the solar cells 3 of the string 7, so as to form a finished solar cell string 1a.

The ribbons 2 herein are kept ready for dispensing on at least two dispensing stations 4, 5 that each have a reserve of ribbon material. At least one ribbon 2, presently however three simultaneously, is then dispensed in an automated manner on at least one of the total of two dispensing stations 4, 5 in the present exemplary embodiment, wherein that dispensing station 4 or 5 from which the at least one ribbon 2 is dispensed is selected depending on a reserve of ribbon material that remains or exists in that dispensing station 4, 5. Switching to the at least one other dispensing station 4 or 5 takes place at the latest upon complete consumption of the reserve of ribbon material of the dispensing station 4 or 5.

Here, a total of three ribbons 2 are dispensed simultaneously in an automated manner from at least one of the two dispensing stations 4, 5, and deposited on the transportation device 8 which comprises the displaceable transportation slide carrier 12 and the one transportation receptacle 13.

In order for the ribbons 2 to be received, the transportation device herein is moved, in the present case displaced, conjointly with the transportation slide carrier 12 and the transportation receptacle 13 to the receiving position 9 or 10, respectively, that is assigned to the respective dispensing station 4, 5. Once the respective receiving position 9 or 10, respectively, has been reached, at least one ribbon 2, in the present case a total of three ribbons 2, is deposited on the transportation device 8. Once the three ribbons 2 have been received, the transportation device 8 is moved to the dispensing position 11 that is adjacent to the string 7 of unconnected solar cells 3 that is be equipped with ribbons 2. As soon as the transportation device 8 has reached the dispensing position 11 thereof, the ribbons 2 are retrieved from the transportation device 8 and fed to the solar cells 3.

In order for a desired number of ribbons 2 to be received, the transportation device 8 having the transportation receptacle 13 herein can be moved, in particular displaced, to the receiving positions 8, 9 that are assigned to the two dispensing stations 4, 5 sequentially and/or in a predetermined sequence.

A route or a displacement path of the transportation device 8 between the two receiving positions 9 and 10, and the dispensing position 11 is determined depending on at least one defined parameter, in particular depending on an existing reserve of ribbon material in the two dispensing stations 4, 5. The route or the displacement path, respectively, of the transportation device 8 herein can be determined such that a reserve of ribbon material of one dispensing station 4, 5, by dispensing ribbons 2 to the transportation device 8, is entirely or partially consumed before a reserve of the other dispensing station 4, 5.

Herein, the transportation slide carrier 12 can be moved in both directions of the double arrow 102, and the transportation receptacle 13 that is configured as the transportation slide 13a can be moved in both directions of the double arrow 100.

The reserve of ribbon material or ribbons 2, respectively, in the two dispensing stations 4, 5 herein is measured or determined by the controller and/or regulator unit 14, and here in particular by means of the monitoring device 16. For this purpose, the monitoring device 16 has at least one sensor 17 as has already been described above.

The controller and/or regulator unit 14 transmits a control signal to the transportation device 8, said control signal depending on the measured or determined reserve of the two dispensing stations 4, 5 and predefining the displacement path and/or the route of the transportation device 8. The drive device 15 of the transportation device 8 can then be correspondingly controlled with the aid of this control signal, and the transportation receptacle 13 that is configured as the transportation slide 13a, and the transportation slide carrier 12 can be correspondingly moved The ribbons 2 on the transportation device 8 are deposited on the predefined transportation receptacles 13 that are configured on the transportation device 8.

The number of transportation receptacles 13 herein can correspond to a number of strings 7 of unconnected solar cells 3 that is to be simultaneously equipped with ribbons 2. In the present exemplary embodiment, one transportation receptacle 13 and one string 7 of unconnected solar cells 3 on the solar cell string bearing 6 are provided.

However, in the case of one exemplary embodiment not illustrated it is provided that depositing places for ribbons 2 of a plurality of strings 7 are disposed on a transportation receptacle 13 that is configured in particular as the transportation slide 13a.

The transportation device 8, or the transportation slide carrier 12 and the transportation receptacle 13 that is configured as the transportation slide 13a, respectively, herein are moved or displaced, respectively, such that the transportation receptacle 13 on the transportation device 8 sequentially reaches the receiving positions 9 and 10 on the two dispensing stations 4, 5. Herein, the transportation receptacle 13 that is configured on the transportation device 8 can be equipped entirely by one dispensing station 4 or 5, or else obtain a part of the ribbons 2 from the one dispensing station 4, 5, and another part, or the balance, respectively, of the ribbons 2 from the respective other dispensing station 4, 5.

When a plurality of transportation receptacles 13 are configured on the transportation device 8, it can be provided that at least one ribbon 2 is deposited on at least one of the transportation receptacles 13 of the transportation device 8 per dispensing cycle.

It is to be stressed once again at this point that a plurality of transportation receptacles 13, in particular when the latter are configured as transportation slides 13a, are displaceable in both directions of the double arrow 100 in a mutually independent manner on the transportation slide carrier 12, so as to approach the individual dispensing stations 4, 5 and to receive ribbons in a predetermined sequence.

In the case of one embodiment of the method it is provided that a ribbon 2 that is deposited on the transportation device 8 by means of the aforedescribed handling device 22 is retrieved from the transportation device 8 that is moved to the dispensing position 11 and fed to the solar cell string 7 that is kept ready.

In order for the ribbons 2 to be able to be dispensed to the transportation device 8 in a predetermined length by means of the two dispensing stations 4 and 5, it is provided that for producing a ribbon 2, a defined piece of ribbon material is unwound in an automated manner from one of the reserve rolls 19 having ribbon material, and upon unwinding is trimmed in an automated manner.

For the production of solar cell strings it is provided that electrically conductive ribbons 2 are dispensed at the dispensing stations 4, 5 that have a reserve of ribbons 2, and fed to at least one string 7 of unconnected solar cells 3. To this end, the ribbons 2 are kept ready for dispensing on at least two dispensing stations 4, 5 that each have a reserve of ribbon material. At least one ribbon 2 is then dispensed in an automated manner on at least one of the at least two dispensing stations 4, 5, wherein the dispensing station 4, 5 from which the at least one ribbon 2 is dispensed is selected depending on a reserve of ribbon material that remains or exists in that dispensing station 4, 5, and wherein switching to the at least one other dispensing station 4, 5 takes place at the latest upon complete consumption of the reserve of the dispensing station 4, 5.

The invention claimed is:

1. A method of transporting lengths of electrically conductive ribbons (2) used in producing solar cell strings, wherein the ribbons (2) are dispensed at dispensing stations (4, 5) that each has a reserve of ribbon material, and fed to at least one string (7) of unconnected solar cells (3) supported by a solar cell bearing (6), whereupon the ribbons (2) are connected to the solar cells (3) of the at least one string (7) to form finished solar cell strings (la), the method comprising:
dispensing at least one of the ribbons (2) in an automated manner from a selected one of the dispensing stations (4, 5), wherein the dispensing station (4, 5) is selected depending on the reserve of ribbon material that remains or exists in that dispensing station (4, 5), and wherein switching to select another of the dispensing stations (4, 5) takes place at the latest upon complete consumption of the reserve of ribbon material of the selected one of the dispensing stations (4, 5);
depositing the at least one dispensed ribbon (2) on a transportation device (8), wherein the transportation device (8) is configured to selectively adjust to receiving positions (9, 10) corresponding to the dispensing stations (4, 5), in that the at least one dispensed ribbon (2) is deposited on the transportation device (8) once the transportation device (8) has adjusted to the receiving position (9, 10) corresponding to the selected one of the dispensing stations (4, 5); and,
moving the transportation device (8), upon receiving the at least one dispensed ribbon (2), to a dispensing position (11) that is adjacent to the solar cell bearing (6), and spaced from the receiving positions (9, 10), to allow the at least one deposited ribbon (2) to be retrieved from the transportation device (8) and fed to the solar cells (3) once the transportation device (8) has reached the dispensing position (11).

2. The method as claimed in claim 1, wherein the at least one dispensed ribbon (2) is deposited on at least one transportation receptacle (13) that is configured on the transportation device (8).

3. The method as claimed in claim 2, wherein the at least one transportation receptacle (13) is configured as a transportation slide (13a) that is selectively movable between receiving positions (9, 10) on a transportation slide carrier (12).

4. The method as claimed in claim 1, wherein a route or a displacement path of the transportation device (8) between the receiving positions (9, 10) and the dispensing position (11) is determined depending on the reserve of ribbon material in the dispensing stations (4, 5), and wherein the route or the displacement path of the transportation device (8) is determined such that the reserve of ribbon material of the selected one of the dispensing stations (4, 5), is entirely consumed before the switching to select the another of the dispensing stations (4, 5).

5. The method as claimed in claim 1, wherein the reserve of ribbon material in the dispensing stations (4, 5) is monitored by a monitoring device (16), with a controller (14) emitting a control signal to a drive device (15) of the transportation device (8) based on the amount of the reserve of ribbon material of the dispensing stations (4, 5).

6. The method as claimed in claim 1, wherein the at least one dispensed ribbon (2) includes a plurality of dispensed ribbons (2) which are deposited on a number of transportation receptacles (13), said number corresponding to a number of the strings (7) of unconnected solar cells (3).

7. The method as claimed in claim 1, wherein the transportation device (8) is adjusted such that at least one transportation receptacle (13) on the transportation device (8) sequentially reaches the receiving positions (9, 10), wherein the at least one dispensed ribbon (2) is deposited on the at least one transportation receptacle (13) of the transportation device (8) per dispensing cycle.

8. The method as claimed in claim 1, wherein the at least one deposited ribbon (2) deposited on the transportation device (8) is retrieved by a handling device (22) and fed to the string (7) of unconnected solar cells (3).

9. The method as claimed in claim 1, wherein the reserve of ribbon material is in roll form, and, wherein, for producing each of the at least one ribbon (2) for dispensing, the ribbon material is unwound from the reserve of ribbon material for the selected dispensing station (4, 5), and, upon unwinding, the ribbon material is trimmed to a predetermined length.

10. A system (1) for producing solar cell strings (la) composed of solar cells (3) that are interconnected by electrically conductive ribbons (2), the system comprising:
a plurality of dispensing stations (4, 5) for dispensing at least one electrically conductive ribbon (2);
at least one solar cell bearing (6) for supporting at least one string (7) of unconnected solar cells (3); and,
at least one transportation device (8) for receiving and transporting the at least one ribbon (2) dispensed from at least one of the dispensing stations (4, 5) to the at least one solar cell bearing (6),
wherein each of the dispensing stations (4, 5) is assigned one receiving position (9, 10) to which the at least one transportation device (8) is movable for receiving the at least one ribbon (2) that is dispensed from the corresponding dispensing station (4, 5), and
wherein the at least one solar cell bearing (6) is assigned a dispensing position (11) to which the at least one transportation device (8) is movable (arrow Pf. 2) for dispensing the at least one ribbon (2) on the at least one string (7) of unconnected solar cells (8) supported on the at least one solar cell bearing (6).

11. The system as claimed in claim 10, wherein the at least one transportation device (8) has at least one transportation receptacle (13) on which the at least one ribbon (2) is received to be transported.

12. The system (1) as claimed in claim 11, wherein a plurality of transportation receptacles (13) is provided corresponding to a number of bearing places (26) on the solar cell string bearing (6), the bearing places (26) being configured to accommodate a plurality of the at least one string (7) of unconnected solar cells (3).

13. The system (1) as claimed in claim 10, wherein the at least one transportation device (8) is movable transversely to the dispensing direction of the at least one ribbon (2)

between the receiving positions (9, 10) that are assigned to the dispensing stations (4, 5).

14. The system (1) as claimed in claim 11, wherein the at least one transportation receptacle (13) of the transportation device (8) is configured as a transportation slide (13*a*) that is selectively movable between the receiving positions (9, 10) on a transportation slide carrier (12).

15. The system (1) as claimed in claim 11, wherein the at least one transportation receptacle (13), with the transportation device (8) being in the dispensing position (11), is aligned in continuation in the direction of longitudinal extent of the at least one string (7) of unconnected solar cells (3) supported on the solar cell string bearing (6).

16. The system (1) as claimed in claim 10, further comprising a controller adapted for controlling the transportation device (8).

17. The system (1) as claimed in claim 16, wherein the controller has a monitoring device (16) for monitoring a reserve of ribbon material in each of the dispensing stations (4, 5), and, wherein the controller is adapted for controlling the movements of the at least one transportation device (8), depending on the reserve of ribbon material (2) in the dispensing stations (4, 5).

18. The system (1) as claimed in claim 17, wherein the monitoring device (16) has a counting installation (18) for monitoring the number of the at least one ribbon (2) dispensed by each of the dispensing stations (4, 5).

19. The system (1) as claimed in claim 10, wherein each of the dispensing stations (4, 5) is assigned one trimming station (20) having a cutting device (21) for trimming the at least one ribbon (2).

20. The system as claimed in claim 10, further comprising a handling unit (22) which is provided for transferring the dispensed ribbons (2) from the at least one transportation device (8), when located in the dispensing position (11), to the at least one string (7) of unconnected solar cells (3).

21. The system (1) as claimed in claim 10, wherein the at least one solar cell bearing (6) is disposed on a conveyor belt.

22. The system (1) as claimed in claim 10, wherein the system (1) has four of the dispensing stations (4, 5) each having one receiving position (9, 10), and two of the at least one transportation device (8), each having six transportation receptacles (13).

* * * * *